United States Patent [19]
Fowler et al.

[11] 4,314,378
[45] Feb. 2, 1982

[54] ANTENNA LOW-NOISE Q SPOILING CIRCUIT

[75] Inventors: Clarence W. Fowler, Elgin; Bruce M. Penrod, Austin, both of Tex.

[73] Assignee: Tractor, Inc., Austin, Tex.

[21] Appl. No.: 91,692

[22] PCT Filed: May 25, 1979

[86] PCT No.: PCT/US79/00356
§ 371 Date: Aug. 27, 1979
§ 102(e) Date: Aug. 27, 1979

[87] PCT Pub. No.: WO80/02782
PCT Pub. Date: Dec. 11, 1980

[51] Int. Cl.³ .............................................. H04B 1/18
[52] U.S. Cl. ..................................... 455/291; 455/292
[58] Field of Search ............... 455/290, 291, 292, 234, 455/266, 295, 269, 273, 274, 182, 192; 330/90, 91, 92, 85, 86; 343/850

[56] References Cited

U.S. PATENT DOCUMENTS

| | | | |
|---|---|---|---|
| 1,907,653 | 5/1933 | Muth | 455/290 |
| 2,641,704 | 6/1953 | Stott | 455/290 |
| 2,774,866 | 12/1956 | Burger | 455/234 |
| 2,787,704 | 4/1957 | Boelens | 455/290 |
| 3,005,093 | 10/1961 | Harrison | 455/292 |
| 3,077,562 | 2/1963 | Key | 455/292 |
| 3,479,609 | 11/1969 | Castelli | 350/305 |
| 3,495,031 | 2/1970 | Poppa | 358/199 |
| 3,510,807 | 5/1970 | Hall | 334/40 |
| 3,528,023 | 9/1970 | Jeffers | 330/277 |
| 3,673,523 | 6/1972 | Russell | 455/182 |
| 3,786,363 | 1/1974 | Lelie | 330/302 |

Primary Examiner—Robert L. Richardson
Assistant Examiner—Tommy P. Chin
Attorney, Agent, or Firm—Arnold, White & Durkee

[57] ABSTRACT

An input coupling circuit for detuning the Q of a high-Q ferrite rod antenna is disclosed. A high-impedance low-noise amplifier is used to amplify the output signal from the LC resonant tank of the rod antenna. A portion of the amplified signal is fed back directly into the magnetic circuit of the antenna tank. This negative feedback reduces the losses produced in the magnetic circuit due to the presence of nearby conductors. As a result of this reduction, an increase in the antenna sensitivity and a decrease in the cross-feed from other nearby antenna is produced.

7 Claims, 1 Drawing Figure

ANTENNA LOW-NOISE Q SPOILING CIRCUIT

BACKGROUND OF THE INVENTION

This invention relates to antenna input detecting circuits. More particularly, it relates to a ferrite rod antenna input coupling circuit for detuning the Q of the antenna to achieve both a broadband frequency response and an increase in the antenna's sensitivity when positioned near conductive parts, i.e. metal supports, printed circuit copper lands, chassis, etc.

It is known in the prior art that the Q of an antenna's input resonant tank circuit may be reduced (spoiled) by applying a portion of the detected antenna signal as negative feedback into the resonant tank circuit. By reducing the Q of the antenna resonant tank detecting circuit, a broadband frequency response is obtained. U.S. Pat. No. 2,787,704 illustrates the use of negative feedback to achieve a constant band-width input frequency response for a high-Q rod antenna. In this reference, the output from the rod antenna resonant tank circuit is buffered by a vacuum tube amplifier and a portion of the buffered signal applied through a feedback transformer into the resonant tank circuit. The secondary of the feedback transformer is connected in series with the tank inductor formed around the ferrite rod. Special tuning capacitors in the feedback circuit vary the feedback ratio of the feedback signal according to the frequency detected by the antenna to achieve a constant bandwidth regardless of the center frequency to which the antenna is tuned.

Some of the advantages of active Q-spoiling are also disclosed and discussed by this reference. That is, the sensitivity of the antenna is not diminished even though the Q of the antenna is reduced. (As understood by those skilled in the art, the antenna sensitivity or signal-to-noise ratio of its output signal, which is expressed in micro-volts per meter, refers to the amount of external magnetic field required to increase the antenna output signal by a factor 1.414 or 3db over the noise level when no external fields are present). This is true because the high input impedance of the active amplifier does not appear as a resistive load to the resonant tank circuit. Resistive loading of a resonant tank reduces the Q but increases the noise in the antenna output signal. Another advantage discussed by this reference relates to the broadband frequency response resulting from the detuning of a high-Q circuit. The negative feedback voltage in series with the resonant tank voltage reduces the Q of the tank to effectively open up the frequency band to detect more frequencies which occur near the resonant center frequency. This enables the antenna to effectively respond to several relatively separated frequencies.

One of the main advantages of a ferrite rod antenna is that it may be contained physically in quite a small volume. Therefore, in receivers which utilize rod antennas, it is inevitable that these antennas will be placed near other components, antenna's and metal parts. The resultant degradation of performance in the antenna's packaged configuration compared with that obtained when the rod antenna is isolated may amount to a having of the Q-factor of the antenna. In addition, the sensitivity of the antenna (signal-to-noise ratio of the detected output signal) is likewise reduced. When more than one rod antenna is placed in the same physical area, such as when two antennas are placed adjacent and orthogonal to one another, a problem of cross-talk between the antennas is created. This cross-talk between antennas produces undesirable signal responses in both antennas. In order to avoid this cross-talk problem, prior art receivers have resorted to elaborate configurations for the antennas. One such technique involves the use of four high-permeability ferromagnetic rods arranged in a square with the resonant tank coils for opposite rods interconnected to form a single effective rod antenna. For this technique, the physical configuration of the ferrite rods is critical in order for the antenna to maintain its desired frequency response and, at the same time, to minimize the cross-talk.

A long range navigation system which employs a plurality of transmitters transmitting on discrete frequencies, such as the Omega Navigational System, requires a signal receiver whose antenna is capable of detecting each of the very low frequency (VLF) signals that are transmitted. In such a receiver, two orthogonally positioned ferrite rod antennas are required in order to produce a detected signal regardless of the orientation of the receiver.

Accordingly, it would be desirable to provide a rod antenna input coupling circuit which enables the antenna to have a broadband frequency response while minimizing the cross-talk between adjacent rod antennas, and to have an increased sensitivity by reducing the antenna's internal losses due to the presence of nearby conductors.

SUMMARY OF THE INVENTION

In accordance with this invention, an antenna input coupling circuit for detuning the Q of a high-Q rod antenna resonant tank circuit is provided. Detuning of the Q of the antenna resonant tank by the present invention increases the antenna sensitivity by desensitizing the antenna to the presence of nearby conductors. A parallel inductor-capacitor resonant tank circuit is used to produce an antenna detect signal in response to the magnetic field generated in the ferrite rod by the electro-magnetic field detected by the antenna. A high input impedence amplifier is used to amplify the antenna detect signal. Associated with the ferrite material of the rod antenna is a second feedback inductor which is magnetically coupled to the magnetic field present in the resonant tank inductor. A feedback resistor is connected between the output of the amplifier and the feedback inductor to apply a portion of the amplifier output signal back to the magnetic circuit of the resonant tank. The signal fed back is in a negative sense. The necessary phase inversion to achieve negative feedback may be accomplished by the arrangement of the turns of the feedback inductor around the ferrite rod material or it may be produced by inversion through the amplifier.

BRIEF DESCRIPTION OF THE DRAWINGS

For a fuller understanding of the nature and objects of the invention, reference should be had to the following detailed description taken in connection with the accompanying drawings, in which.

DETAILED DESCRIPTION OF THE PREFERRED EMBODIMENT

Figure 1:
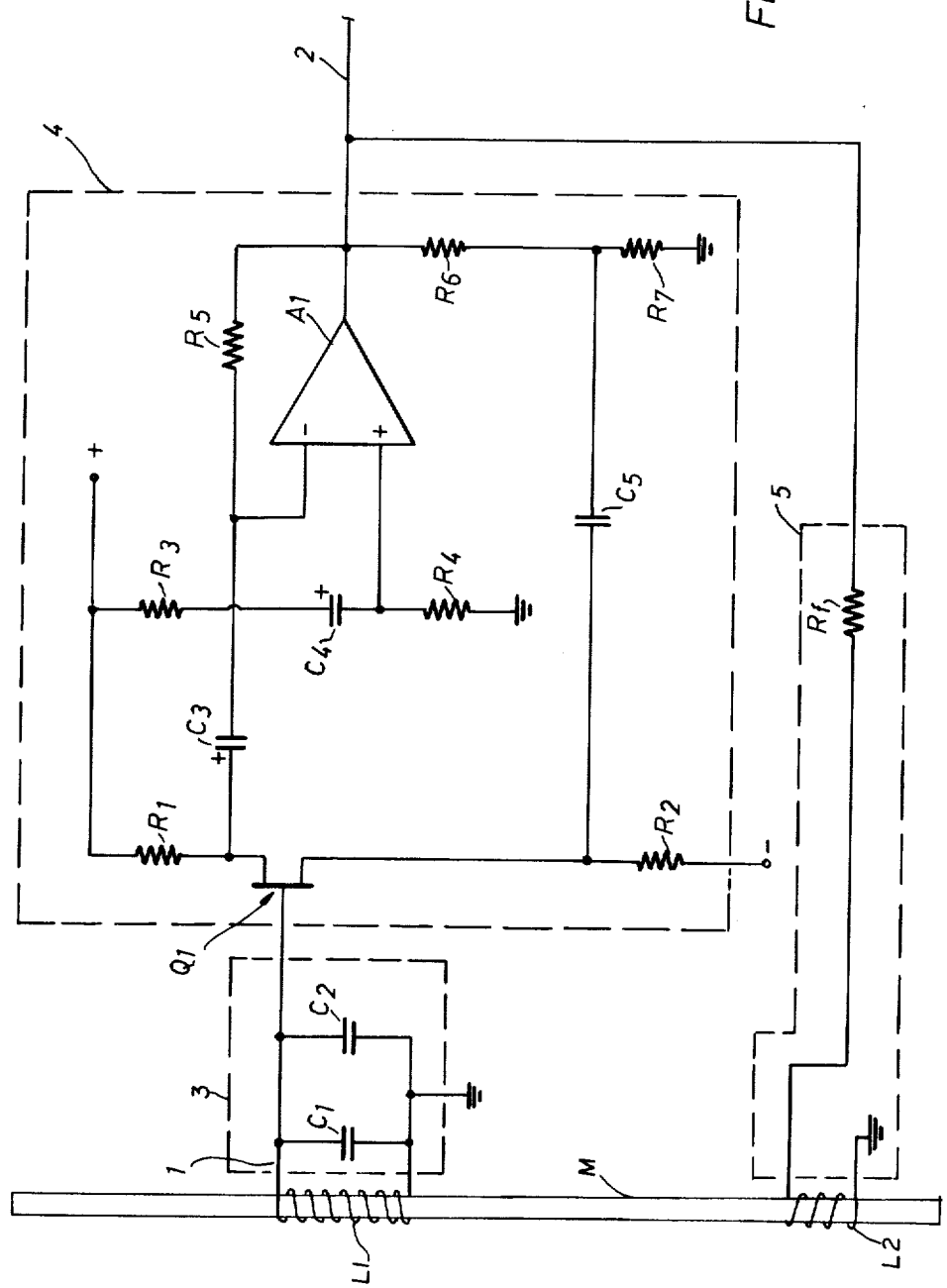
FIG. 1 is a circuit diagram of the preferred embodiment of the present invention.

Referring to FIG. 1 which is a circuit diagram of the preferred embodiment of the present invention, a high permeability ferrite rod M is shown magnetically coupled to inductors L1 and L2. That is, the magnetic flux in rod M passes through both inductors. Both inductors L1 and L2 consist of a number of turns wrapped around the ferrite rod M. Connected in parallel to inductor L1 is a parallel combination of capacitors C1 and C2. Capacitors C1, C2 and inductor L1 comprise the rod antenna LC resonant tank circuit 3. The magnetic field produced in the ferrite material M by the electromagnetic field detected by the antenna generates the antenna detect signal. The antenna detect signal is inputted to a negative feedback means consisting of amplifier 4 and coupling means 5. The negative feedback means functions to produce the antenna output signal 2 by amplifying the antenna detect signal 1 and to feed a portion of the amplified signal back into the magnetic circuit of the resonant tank 3.

For the preferred embodiment, amplifier 4 consists of a field effect transistor Q1 coupled to an operational amplifier A1. The high-impedance low-noise field effect transistor Q1 is used both to provide amplification and to present a high-impedance load to the antenna detect signal 1. The amplified signal from Q1 is capacitively coupled through capacitor C3 to the inverting input of operational amplifier A1. The series circuit consisting of resistor R3, capacitor C4 and resistor R4 is connected to the non-inverting input of amplifier A1. This circuit provides an identical input impedence circuit to the non-inverting input as is present on the inverting input in order to balance the input currents to amplifier A1. Operational amplifier A1 operates as an inverting amplifier whose closed loop gain is determined by the ratio of R5 to R1. A voltage divider network consisting of resistors R6 and R7 is used to apply a portion of the amplified antenna detect signal 2 back into the field effect transistor amplifier circuit via capacitor C5. As a result, the closed loop gain of the amplifier 4 is controlled by the ratio of resistors R6 and R7. For the preferred embodiment, the close loop gain of amplifier is approximately 40 db.

Also connected to the output of amplifier 4 is a coupling means 5 consisting of a feedback resistor Rf and inductor L2. As previously mentioned, inductor L2 is coupled to the magnetic material M so that it responds to the same magnetic field as inductor L1. The turns of inductor L2 are applied to the ferrite rod M in the same sense as inductor L1. That is, the voltage applied to inductor L2 will produce a voltage on L1 that is in phase with the voltage on L2. Because of the inversion that is present in amplifier 4, the magnetic field produced by the current in L2 will be 180° out of phase with the antenna detect signal 1. The magnitude of feedback resistor Rf controls the amount of current applied to inductor L2 thereby controlling the amount of signal that is fed back into the antenna's magnetic circuit.

While the preferred embodiment shows an inverting amplifier 4 to produce the necessary phase inversion to achieve negative feedback, it is obvious to a person of ordinary skill in the art that other ways are possible to achieve negative feedback, such as the use of a non-inverting amplifier 4 with a reversal in the sense of inductor L2 relative to inductor L1. Additionally, it is obvious that other ways of controlling the amount of signal fed back other than by the use of the feedback resistor in series with inductor L1 are possible.

As explained above, the sensitivity of an antenna is defined to be the amount of external magnetic field, expressed in micro-volts/meter, needed to increase the antenna output signal by a factor of 3 db. This sensitivity may be measured by isolating the antenna from all external magnetic fields and nearby conductors and measuring the noise level present on the output of amplifier 4. Having measured this voltage, the antenna is subjected to a magnetic field of the appropriate frequency to produce an antenna output response signal. The level of magnetic field is increased until the measured voltage on the output of amplifier 4 increases by a factor of 3 db. At this point, the amount of required signal to produce the desired antenna output signal above the level of noise when the antenna was isolated is the measure of the antenna's sensitivity. If the antenna resonant tank is unloaded and the antenna is isolated as described above, the sensitivity of the antenna will be the same as when the antenna is isolated and there is Q spoiling (loaded).

However, if the antenna is placed in the proximity of electrical conductors, and the sensitivity measurement is made for both the unloaded and the Q spoiled condition according to the present invention, an improvement in the antenna sensitivity will be measured. That is, the losses in the ferrite rod due to the proximity of conductive parts is reduced when negative feedback of the amplified antenna detect signal 2 is fed back into the magnetic circuit of the rod antenna. Nearby conductors respond to the magnetic field of the rod antenna by producing eddy currents in their conductive surfaces. These eddy currents, in turn, represent magnetic losses in the magnetic circuit. The resultant degradation of performance compared with that obtained when the rod antenna is isolated may amount to a having of the Q factor. Because the feedback signal of the present invention is applied to the magnetic circuit in a negative sense, the magnitude of the induced eddy currents in nearby conductors is significantly reduced—as much as 30:1. The eddy current induced losses in the magnetic material M appears in the antenna output signal as noise. Because the antenna is desensitized to the presence of the nearby conductors and to the presence of other nearby antennas, the noise level is reduced. Accordingly, the amount of external magnetic signal needed to produce the 3 db increase in the antenna's output signal above this noise is reduced. Hence, an improved sensitivity.

It should be clear that the values of the various circuit components depicted in the drawing and described above will vary in dependence upon the intended use. In a presently preferred embodiment of a Q spoiled rod antenna used in a receiver to detect the radio signals in the Omega Navigational System, the table below sets out exemplary values which have been found satisfactory.

| TABLE OF EXEMPLARY VALUES | |
|---|---|
| Reference Designation | Value |
| M | ferro-magnetic high permeability material |
| Q1 | 2N 6550 |
| A1 | 4136 by Raytheon |
| L1 | 1200 turns of #30 wire |
| L2 | 2 turns |
| C1 | 1800 pf (C1 + C2 |
| C2 | select for center nominal = frequency 2100 pf) |
| C3 | 2.2 micro-farads |
| C4 | 2.2 micro-farads |
| C5 | 10 micro-farads |
| R1 | 1.21 K |

-continued

TABLE OF EXEMPLARY VALUES

| Reference Designation | Value |
| --- | --- |
| R2 | 510 |
| R3 | 1.21 K |
| R4 | 18.7 K |
| R5 | 42.2 K |
| R6 | 1.21 K |
| R7 | 20 ohms |
| Rf | 1.5 K (selected for desired Q) |

In describing the invention, reference has been made to its preferred embodiment. However, those skilled in the art and familiar with the disclosure of the invention may recognize additions, deletions, substitutions or other modifications which would fall within the purview of the invention as defined in the appended claims.

What is claimed is:

1. A detuning circuit for detuning an unloaded Q quality factor of a rod antenna, said rod antenna having a rod of magnetic conductive material defining a magnetic circuit, said detuning circuit including an LC resonant tank circuit magnetically coupled to a magnetic field induced in the magnetic circuit of the rod antenna by detected radio frequency signals, the tank circuit having loaded and unloaded Q quality factors, and where the tank circuit generates an output signal in response to the magnetic field generated in said magnetic circuit by the radio frequency signals, the detuning circuit comprising:
   (a) a low-noise field effect transistor amplifier, for providing a high impedence load to said tank circuit, and for amplifying the tank output signal without introducing any appreciable noise to the rod antenna output signal;
   (b) an operational amplifier connected to the output of said transistor amplifier, said operational amplifier and said transistor amplifier cooperating together to produce the antenna output signal;
   (c) an inductor magnetically coupled to the magnetic circuit of the antenna; and
   (d) a feedback coupler, for negatively coupling a portion of the antenna output signal to said inductor, said coupler and said inductor cooperating to establish the amount of antenna output signal negatively fed back.

2. The detuning circuit of claim 1 wherein said feedback coupler is a resistor.

3. An input coupling circuit for reducing an unloaded Q quality factor of a rod antenna to enable the antenna to detect radio frequencies without reducing the sensitivity of the antenna due to internally generated noise from the detuning circuit itself, cross-talk from nearby other antenna or nearby electrical conductors, the rod antenna including a rod of magnetic conducting material defining a magnetic circuit, the coupling circuit comprising:
   (a) a resonant tank circuit magnetically coupled to the magnetic circuit of the rod, for producing a detect signal in response to the magnetic field generated in said rod by the received radio frequencies; and
   (b) a negative feedback means, for amplifying, without adding any appreciable noise, the detect signal to produce the antenna output signal, and for negatively feeding back a portion of the antenna output signal directly into the magnetic field of said rod thereby desensitizing the antenna to nearby conductors and other antenna.

4. The detuning circuit of claim 3 wherein the negative feedback means comprises:
   (a) a low-noise amplifier operably connected to said resonant tank circuit, for amplifying the detect signal to produce the rod antenna output signal, said amplifier having an input impedance large enough to prevent resistive loading to said resonant tank, said amplifier amplifying the detect signal without adding any appreciable noise to the antenna output signal; and
   (b) a coupling means for coupling a portion of the rod antenna output signal into the magnetic field of said tank circuit, said amplifier and said coupling means producing a negative feedback signal.

5. The detuning circuit of claim 4 wherein said amplifier comprises:
   (a) a low-noise field effect transistor amplifier, for providing amplification for the detect signal without introducing any appreciable noise to the detect signals; and
   (b) an operational amplifier associated with said transistor amplifier, said operational amplifier and said transistor amplifier cooperating together to produce the rod antenna output signal.

6. The detuning circuit of claim 4 wherein said coupling means comprises:
   (a) an inductor which is magnetically coupled to the magnetic circuit of the rod; and
   (b) a feedback resistor for coupling the rod antenna output signal to said inductor, said resistor cooperating with said inductor to establish the amount of output signal negatively fed back.

7. An input coupling circuit for a rod antenna, the coupling circuit enabling radio frequencies to be received through the rod antenna without a loss in antenna sensitivity, and where the rod antenna has a rod of magnetically conducting material defining a magnetic circuit of the rod antenna, the rod antenna generating an antenna output signal, the coupling circuit including, an LC resonant tank circuit magnetically coupled to the magnetic circuit of the rod antenna, for generating an output signal in response to the received radio frequencies, the LC tank establishing both a high Q unloaded quality factor and the sensitivity of the antenna, the coupling circuit comprising:
   (a) a low-noise, high input impedance amplifier for providing a high impedence load to said tank circuit, and for amplifying the tank output signal without introducing any appreciable noise to the tank output signal, said amplifier generating the antenna output signal;
   (b) an inductor magnetically coupled directly to the magnetic circuit of the antenna; and
   (c) a feedback coupler, for negatively coupling a portion of the antenna output signal to said inductor, said coupler and said inductor cooperating to establish the amount of antenna output signal fed back, the negative feedback of the antenna output signal reducing the Q quality factor thereby to enable the antenna to detect radio frequency signals without reducing the sensitivity of the antenna.

* * * * *